(12) United States Patent
Obata et al.

(10) Patent No.: US 6,429,673 B1
(45) Date of Patent: Aug. 6, 2002

(54) PRINTED WIRING BOARD INSPECTION APPARATUS

(75) Inventors: Osamu Obata; Masatoshi Kato, both of Yamanashi (JP)

(73) Assignee: ITC Company Ltd., Yamanashi (JP)

( * ) Notice: Subject to any disclaimer, the term of this patent is extended or adjusted under 35 U.S.C. 154(b) by 0 days.

(21) Appl. No.: 09/429,215

(22) Filed: Oct. 28, 1999

(30) Foreign Application Priority Data

Dec. 29, 1998 (JP) ............................. 10-377535

(51) Int. Cl.$^7$ ......................... G01R 27/26; G01R 27/28

(52) U.S. Cl. ..................... 324/761; 324/754; 324/758; 324/72.5

(58) Field of Search ................................ 324/761, 758, 324/754, 72.5

(56) References Cited

U.S. PATENT DOCUMENTS

| | | | | |
|---|---|---|---|---|
| 3,970,934 A | * | 7/1976 | Aksu ........................... | 324/754 |
| 4,912,400 A | * | 3/1990 | Plante ......................... | 324/754 |
| 5,157,325 A | * | 10/1992 | Murphy ...................... | 324/761 |
| 5,500,606 A | * | 3/1996 | Holmes ....................... | 324/761 |

* cited by examiner

*Primary Examiner*—Glenn W. Brown
*Assistant Examiner*—Wasseem M. Hamdan
(74) *Attorney, Agent, or Firm*—Squire, Sanders, & Dempsey, LLP.; David B. Abel; Dave B. Koo

(57) ABSTRACT

The pneumatic cylinder is fixed on between the lower member of the upper unit and the lower member of the lower unit. As the shaft of the pneumatic cylinder extends, the upper unit starts lowering by its own weight at first. When the upper unit reaches to the point limited by the stopper, the lower unit then starts rising and the lower unit stops in a state where the shaft has extended to its full length. In this state, the probes and are in contact with the printed wiring board as applying a specified pressure to it.

7 Claims, 5 Drawing Sheets

(A)

(B)

(C)

PRIOR ART

PRINTED WIRING BOARD INSPECTION APPARATUS

BACKGROUND OF THE INVENTION

1. Field of the Invention

The present invention relates to a printed wiring board inspection apparatus for inspecting a printed wiring board using probes. A printed wiring board to be inspected may be any of a printed wiring board mounted with components and a printed wiring board not yet mounted with components.

2. Prior Art

A conventional apparatus for inspecting a printed wiring board from the upper face and the lower face of it has been disclosed in Japanese Patent Laid-Open Publication No.Hei 10-282178. FIG. 5 shows roughly the apparatus disclosed in said patent application. A conventional apparatus 500 is described with reference to the figure. A supporting body 501 is provided with guide rails 502, and a printed wiring board supporting plate 510 is placed on the guide rails 502. A printed wiring board 511 is placed at a specified position on the printed wiring board supporting plate 510. An upper inspection unit 521 is provided above the printed wiring board 511 through an actuator 523 fixed to the supporting body 501. A lower inspection unit 531 is provided below the printed wiring board 511 through an actuator 533 fixed to the supporting body 501.

When inspecting a printed wiring board 511, the printed wiring board 511 is placed on the printed wiring board supporting plate 510 and is carried along the guide rails 502 into the supporting body 501. Next, the upper inspection unit 521 is lowered by the actuator 523, and probes 522 touch and press the upper face of the printed wiring board 511. Next, the lower inspection unit 531 is lifted up by the actuator 533, and probes 532 touch and press the lower face of the printed wiring board 511. The probes 522 and 532 are connected to an unillustrated tester through unillustrated wiring. In this state, the tester gives signals to the printed wiring board 511 through the probes 522 and 532 and at the same time, receives signals from the printed wiring board 511 through the probes 522 and 532. By analyzing said signals, the apparatus inspects the printed wiring board for short circuit or breaking of wires. After the inspection has ended, the lower inspection unit 531 is lowered and then the upper inspection unit 521 is lifted up, and after this, the printed wiring board 511 is taken out.

And the upper inspection unit 521 and the lower inspection unit 531 each are specific to printed wiring boards of a kind to be inspected. In case of inspecting printed wiring boards of another kind, therefore, each of the upper inspection unit 521 and the lower inspection unit 531 must be replaced with another inspecting unit.

However, the above-mentioned prior art has the following problems. First, it needs an actuator which is a driving means for moving up and down an upper inspection unit or a lower inspection unit for each unit. Therefore, the apparatus becomes large and heavy. And since it needs a number of components, there is also a problem that the apparatus increases in assembling man-hour and in component cost.

Second, since there is an actuator for moving up and down the upper inspection unit in the upper part of the apparatus, the upper part of the apparatus is made complicated in structure. As the result, there is a problem that such an upper structure of the apparatus as an actuator and the like hinders a replacing operation at the time of replacing the upper inspection unit and the lower inspection unit with other units.

An object of the present invention is to provide a printed wiring board inspection apparatus which is small in size, light in weight and simple in structure, and makes it easy to replace an upper inspection unit and a lower inspection unit with other units.

SUMMARY OF THE INVENTION

According to the present invention, a printed wiring board inspection apparatus for inspecting a printed wiring board by making probes touch the upper face and the lower face of said printed wiring board placed at a specified position, said printed wiring board inspection apparatus comprising;

a supporting body having a printed wiring board holding portion for holding said printed wiring board at a specified position, an upper unit provided with probes for inspecting the upper face of said printed wiring board, a lower unit provided with probes for inspecting the lower face of said printed wiring board, and a single driving means for moving up and down said upper unit and said lower unit, wherein;

said upper unit and said lower unit are held by said supporting body so as to be able to move up and down, and said driving means moves up and down said upper unit and said lower unit relatively to said supporting body.

And since a driving means for driving an upper unit and a lower unit is moved up and down relatively to a supporting body, the single driving means can move up and down the upper unit and the lower unit by itself. Accordingly, the inspection apparatus can be made small and light.

And in a printed wiring board inspection apparatus of the present invention, said upper unit is composed of an upper member provided with said probes, a lower member joined to said driving means and a coupling member for coupling both of them with each other, and said lower unit is composed of an upper member provided with said probes, a lower member joined to said driving means and a coupling member for coupling both of them with each other.

Therefore, since the coupling members are held so as to be able to move up and down, the upper unit and the lower unit move up and down relatively to the supporting body, namely, to a printed wiring board, and the probes of the upper unit and the lower unit touch the printed wiring board, and thereby the printed wiring board can be inspected. Therefore, in case of inspecting a printed wiring board of another kind, it is enough to replace only the upper member of the upper unit and the upper member of the lower unit with other members.

And since the lower member of the upper unit and the lower member of the lower unit are moved up and down by a driving means provided at the lower part of the apparatus, the upper structure of the inspecting apparatus is made simple.

Furthermore, in a printed wiring board inspection apparatus of the present invention, the sum of the spacing between said lower member of the upper unit and said lower member of the lower unit and the spacing between said upper member of the upper unit and said upper member of the lower unit is kept at a constant value in a process of moving up and down said upper unit and said lower unit.

Accordingly, when the spacing between the lower member of the upper unit and the lower member of the lower unit is made wide by the driving means, the spacing between the upper member of the upper unit and the upper member of the lower unit is made narrow. In other words, the upper unit is lowered by its own weight and the lower unit is lifted by a force from the driving means, and thereby the probes touch a printed wiring board and the apparatus comes into a state where inspection can be performed.

And when the spacing between the lower member of the upper unit and the lower member of the lower unit is made narrow after the inspection has ended, the spacing between the upper member of the upper unit and the upper member of the lower unit is made wide. In other words, the lower unit is lowered by it sown weight and the upper unit is lifted by a force from the driving means, and thereby the probes are detached from the printed wiring board and the apparatus returns to a state before the inspection is started.

And in a printed wiring board inspection apparatus of the present invention, said driving means is disposed between said lower member of the upper unit and said lower member of the lower unit, and moves up and down said upper unit and said lower unit by changing the spacing between said lower member of the upper unit and said lower member of the lower unit.

Accordingly, when the spacing between the lower member of the upper unit and the lower member of the lower unit is made wide by the driving means, the upper unit is lowered by its own weight and the lower unit is lifted by a force from the driving means, and thereby the probes touch a printed wiring board and the apparatus comes into a state where inspection can be performed. And when the spacing between the lower member of the upper unit and the lower member of the lower unit is made narrow after the inspection has ended, the lower unit is lowered by its own weight and the upper unit is lifted by a force from the driving means, and thereby the probes are detached from the printed wiring board and the apparatus returns to a state before the inspection is started.

That is to say, according to the present invention, since a dedicated driving means for driving the upper unit at the time of probing becomes unnecessary, the upper structure of the inspection apparatus is simplified and makes it easy to replace the upper member provided with probes of the upper unit and the upper member with probes of the lower unit with other members.

DETAILED DESCRIPTION OF THE PREFERRED EMBODIMENT

Figure 1:
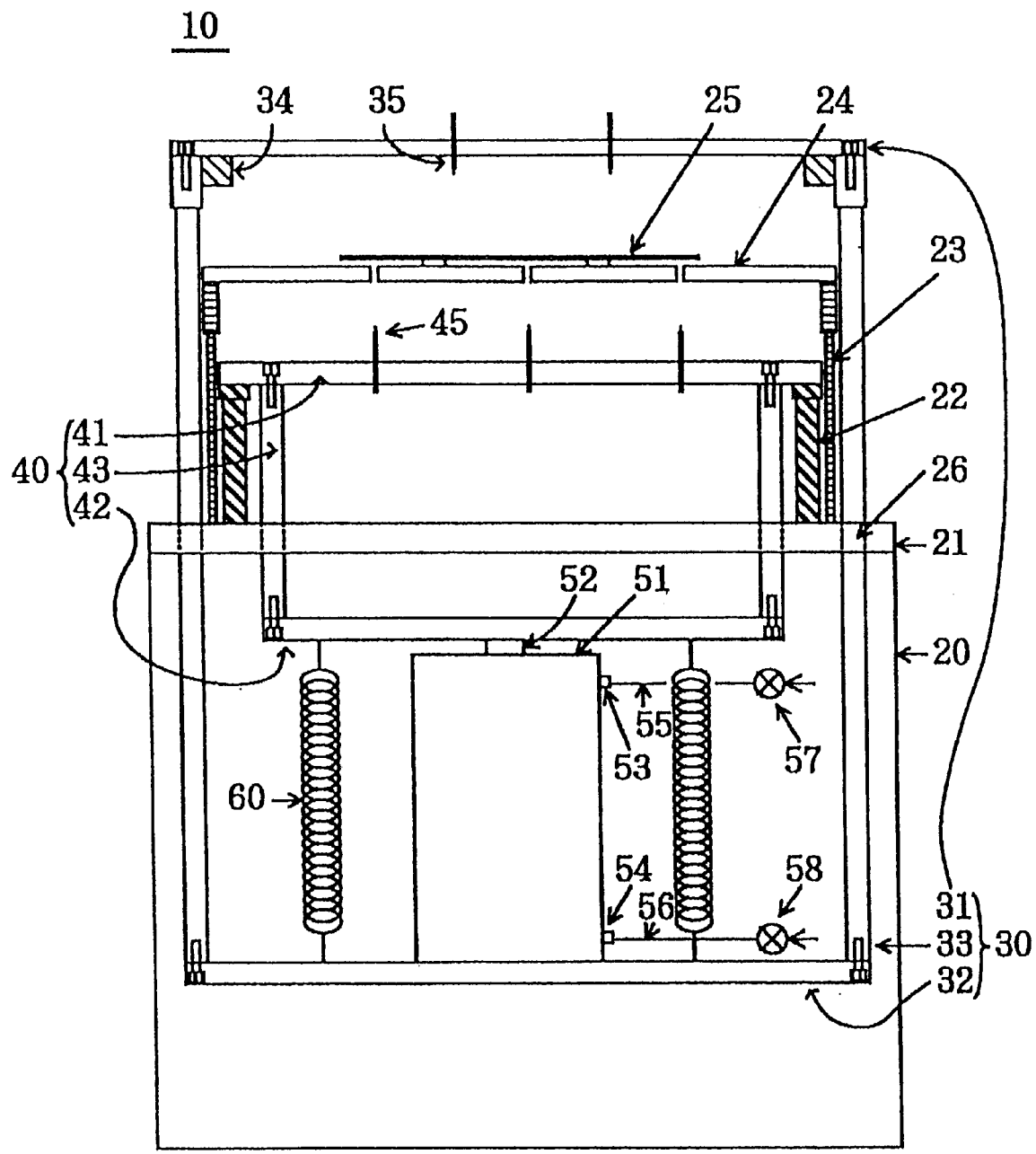
FIG. 1 is a schematic figure showing a state of an inspection apparatus prior to starting inspection of a printed wiring board.

An embodiment of a printed wiring board inspection apparatus of the present invention is described in detail with reference to the drawings in the following. FIG. 1 is a front view showing a printed wiring board inspection apparatus 10 of the present invention, and shows a state where a printed wiring board 25 has been carried into the inspection apparatus. The main components of the apparatus include a supporting body 20 forming the base of the apparatus, an upper unit 30 and a lower unit 40, and a pneumatic cylinder 51 which is a riving means.

A base plate 21 made of aluminum is provided on the top of the supporting body 20. A printed wiring board supporting plate supporting stand 23 for placing and fixing a printed wiring board supporting plate 24 on it is fixed on the upper face of the base plate 21. A printed wiring board 25 is placed at a specified position on the printed wiring board supporting plate 24. Although not illustrated, the upper part of the printed wiring board supporting plate stand 23 has a guide-rail structure so as to slide and bring in the printed wiring board supporting plate 24. The printed wiring board supporting plate 24 and the printed wiring board supporting plate supporting stand 23 form a printed wiring board holding part of this apparatus.

The upper unit 30 is composed of an upper member 31 having probes 35 for inspecting the upper face of the printed wiring board 25, a lower member 32 to which the pneumatic cylinder 51 is fixed, and four coupling members 33 (the figure shows the two members at this side out of them) for coupling the upper member and the lower member to each other, said coupling members each being in the shape of a pole. The upper member 31 and the lower member 32 are respectively fixed to the coupling members 33 by screws or the like.

The lower unit 40 is composed of an upper member 41 having probes 45 for inspecting the lower face of the printed wiring board 25, a lower member 42 to which the shaft 52 of the pneumatic cylinder 51 is fixed, and four coupling members 43 (the figure shows the two members at this side out of them) for coupling the upper member 41 and the lower member 42 to each other, said coupling members each being in the shape of a pole. The upper member 41 and the lower member 42 are respectively fixed to the coupling members 43 by screws or the like.

Each of the coupling members 33 of the upper unit 30 and the coupling members 43 of the lower unit 40 passes through a through hole 26 provided in the base plate 21 and is held so as to able to move up and down relatively to the base plate 21. In other words, the upper unit 30 and the lower unit 40 are held so as to be able to move up and down relatively to the supporting body 20.

And the lower unit 40 is placed on a lower unit supporting stand 22 by its own weight.

The pneumatic cylinder 51 which is a driving means is fixed to the lower member 32 of the upper unit 30. And the shaft 52 of the pneumatic cylinder 51 is fixed to the lower member 42 of the lower unit 40. The pneumatic cylinder 51 has two compressed air intakes 53 and 54, which are connected through pipes 55 and 56 and opening and closing valves 57 and 58 to a compressed air source not illustrated. When compressed air is introduced through the lower compressed air intake 54, the shaft 52 of the pneumatic cylinder 51 is moved so as to project from the pneumatic cylinder 51. And when compressed air is introduced through the upper compressed air intake 55, the shaft 52 of the pneumatic cylinder 51 is moved so as to withdraw into the pneumatic cylinder 51. Accordingly, it is possible to change the spacing between the lower member 32 of the upper unit 30 and the lower member 42 of the lower unit 40 by controlling the opening and closing valves 57 and 58. In order to prevent the upper unit 30 from lowering in case that the compressed air supplying system has got out of order, the lower member 32 of the upper unit 30 and the lower member 42 of the lower unit 40 are coupled to each other by springs 60.

Next, procedure and operation at the time of inspecting a printed wiring board 25 are described. First, a printed wiring board 25 is placed at a specified position on the printed wiring board supporting plate 24. Next, the printed wiring board supporting plate 24 is taken in from this side along the unillustrated guide rails provided on the printed wiring board supporting plate supporting stand 23. In order to inspect the printed wiring board 25, it is necessary to bring the probes 35 and 45 of the upper unit 30 and the lower unit 40 into contact with the printed wiring board 25. Thereupon, the opening and closing valves 57 and 58 are controlled so that the shaft 52 of the pneumatic cylinder 51 moves so as to project from the pneumatic cylinder 51. As the result, a force to widen the spacing between the lower member 32 of the upper unit 30 and the lower member 42 of the lower unit 40 is generated. This force becomes a force to lower the upper unit 30 or lift the lower unit 40. In order to lift the lower unit, a force to lift it against their own weights of the upper unit 30 and the lower unit 40 needs to be applied. On the other hand, a force to lower the upper unit 30 by its own weight acts on the upper unit 30. According to a law of mechanics, the lower unit 40 is not moved but only the upper unit 30 starts lowering.

When a time elapses further, the upper unit 30 lowers to a position where the probes 35 come into contact with the printed wiring board 25. When it lowers furthermore, since the lowering of the upper unit 30 is limited by a stopper 34, the apparatus comes into a state shown in FIG. 2. In the state shown in FIG. 2, a movable pin 423 of a probe 420 shown in FIG. 4(A) has been pressed into a probe case 422 and a spring 421 inside the probe is made shorter than that shown in FIG. 4(A) so that no defective contact occurs between the probes 35 and the printed wiring board 25. An upward pressure by the spring 421 inside the probe 420 is applied to the upper unit 30. During a period from a time when the probe 35 has first touched the printed wiring board 25 to a time when the apparatus comes into the state shown in FIG. 2, the pressure by the springs in the probes 35 is applied to the upper unit 30. Accordingly, in order to lower the upper unit 30 without lighting the lower unit 40, the following expression (1) must be satisfied.

(Weight of the upper unit+weight of the lower unit+weight of the pneumatic cylinder)>the pressure of all the probes     (1)

The pressure of all the probes is the product of the number of probes 35 and the pressure of a movable probe pin per probe. For example, in case that the upper unit 30 is provided with 400 probes 35 and the pressure per probe is 150 gf, the pressure of all the probes is 60 kgf.

And considering a fact that the weight of a pneumatic cylinder 51 is comparatively small and an allowable value in design, an inspection apparatus is designed so as to satisfy the following expression (2).

(Weight of the upper unit+weight of the lower unit)>the pressure of all the probes.     (2)

And since printed wiring boards of plural kinds are inspected using an inspection apparatus of the present invention, the inspection apparatus is designed so that the expression (2) is satisfied, considering a case of performing inspection by means of a maximum number of probes.

Figure 2:
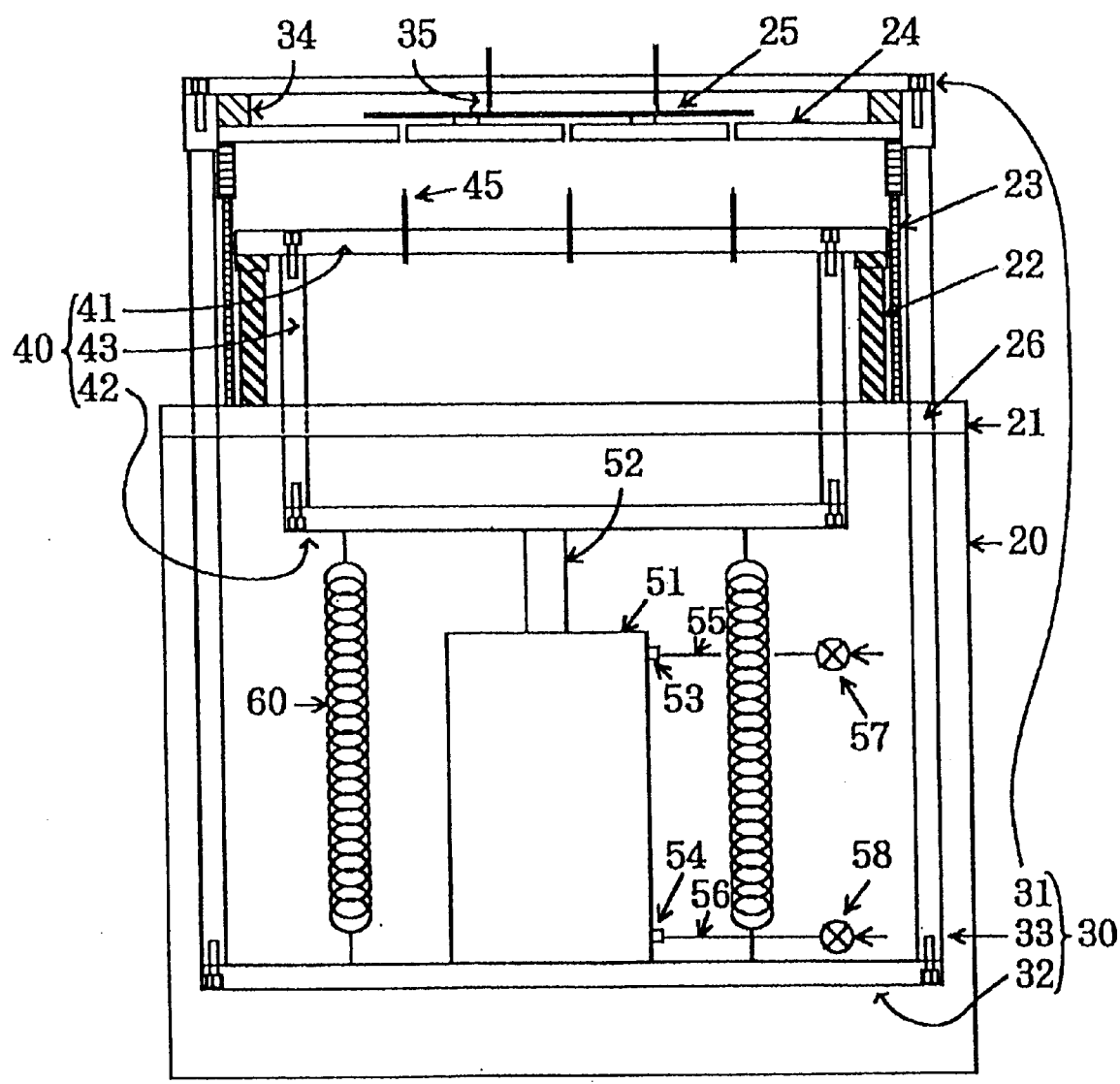
FIG. 2 is a schematic figure showing a state of the inspection apparatus when the upper unit has been lowered.
Figure 3:
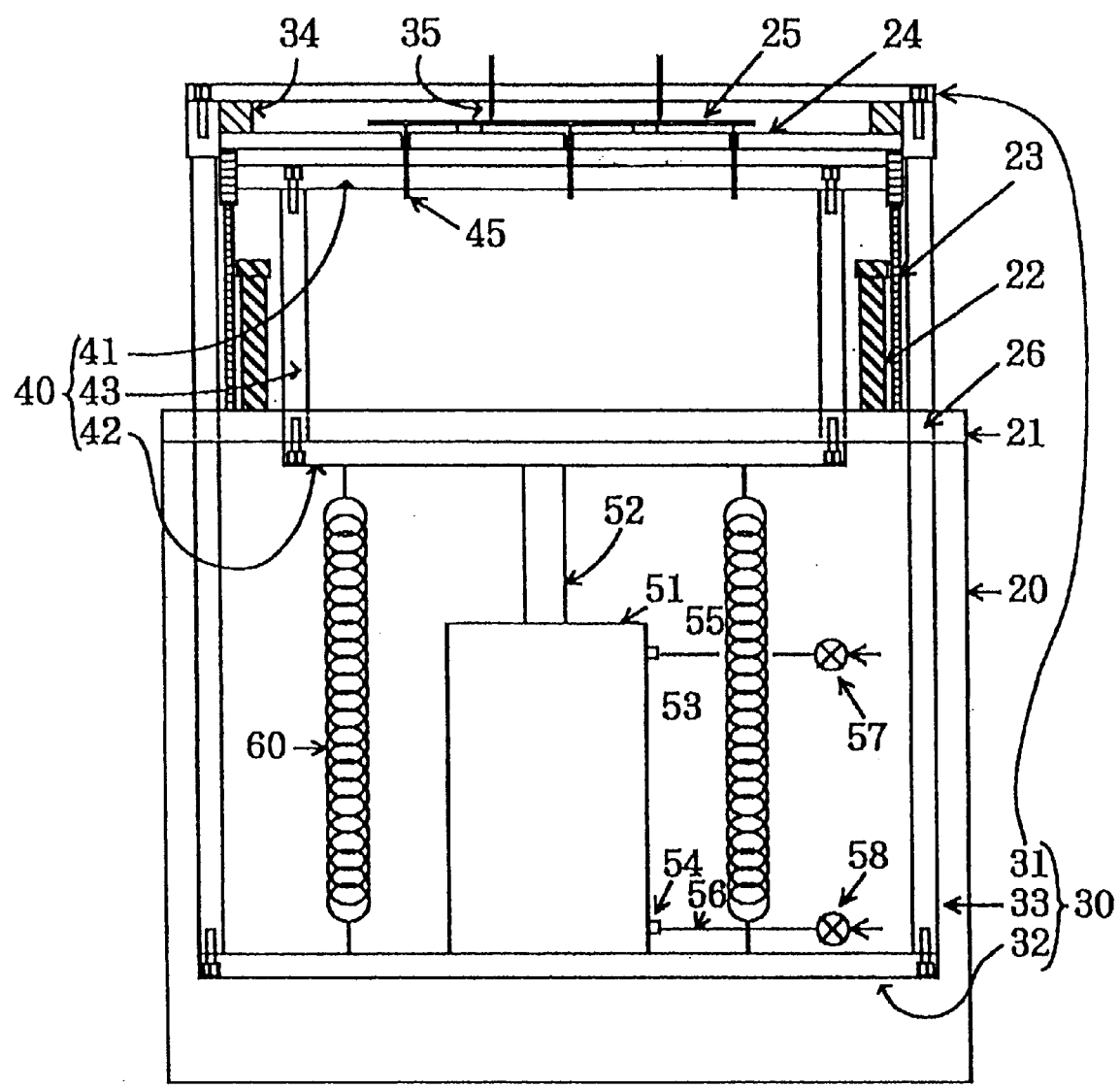
FIG. 3 is a schematic figure showing a state of the inspection apparatus when it is inspecting the printed wiring board.

A case that the shaft 52 of the pneumatic cylinder 51 extends further from the state of FIG. 2 is described. Since lowering of the upper unit 30 is limited at a point of time of FIG. 2, the lower unit 40 starts rising. And the lower unit 40 stops in a state where the shaft 52 has extended to its full length, namely, in a state shown in FIG. 3. In the state of FIG. 3, the probes 45 of the lower unit 40 are in contact with the printed wiring board 25 as applying a specified pressure to it. In case of using a stepping motor instead of the pneumatic cylinder 51 as a driving means, it is possible to control a stop position of the lower unit 40 by controlling a driving signal to be given to the stepping motor.

In the state of FIG. 3, an unillustrated tester gives signals through the probes 35 and 45 to the printed wiring board 25 and at the same time, receives signals from the printed wiring board 25 through the probes 35 and 45. And by analyzing the signals, it inspects the printed wiring board 25 for short circuit or breaking of wire. The respective probes are connected to the unillustrated tester through unillustrated wiring.

When inspection of the printed wiring board 25 has ended, the apparatus controls the opening and closing valves 57 and 58 so that the shaft 52 of the pneumatic cylinder 51 withdraws into the pneumatic cylinder 51, namely, so that the shaft 52 acts so as to shorten the spacing between the lower member 32 of the upper unit 30 and the lower member 42 of the lower unit 40. As the result, a force to lift the upper unit 30 or lower the lower unit 40 is generated. Since its own weight downward is applied to the lower unit 40, the lower unit 40 starts lowering and when the lower unit 40 comes down to a position where its lowering is limited by the lower unit supporting stand 22, the apparatus comes into the state of FIG. 2, and the lower unit 40 stops lowering. However, since a force to shorten the spacing between the lower member 32 of the upper unit 30 and the lower member 42 of the lower unit 40 is applied to them, the upper unit 30 next starts rising and then stops at a position where the shaft 52 has finished withdrawing into the pneumatic cylinder 51, namely, stops in the state shown in FIG. 1. After this, the printed wiring board 25 is taken out from the inspection apparatus 10 and then a printed wiring board to be next inspected is taken into the apparatus 10.

Taking the above description into account, features of the present invention are described. Comparing FIG. 1 with FIG. 2, it is seen that the pneumatic cylinder 51 which is a driving means moves up and down relatively to the supporting body 20. By utilizing this feature, it is possible to drive the upper unit 30 and the lower unit 40 by means of a single driving means. And by utilizing the forces of gravity acting on the upper unit 30 and the lower unit 40, one kind of operation of projecting the shaft 52 of the pneumatic cylinder 51 can perform the operations opposite to each other of lowering the upper unit 30 and lifting the lower unit 40. Furthermore, since the sum of the spacing between the lower member 32 of the upper unit 30 and the lower member 42 of the lower unit 40 and the spacing between the upper member 31 of the upper unit 30 and the upper member 41 of the lower unit 40 is kept at a constant value in a process of moving up and down the upper unit 30 and the lower unit 40, a projecting length of the shaft 52 of the pneumatic cylinder 51 is equal to the sum of a lowering length of the upper unit 30 and a rising length of the lower unit 40. Accordingly, if a lowering operation of the upper unit 30 is limited at a specified position, a stroke of the shaft 52 of the pneumatic cylinder 51 can be distributed into a lowering length of the upper unit 30 and a rising length of the lowering unit 40.

In this embodiment, a pneumatic cylinder of 80 mm in stroke is used and when the pneumatic cylinder is changed from the state of FIG. 1 into the state of FIG. 3, the upper unit 30 lowers by 50 mm and the lower unit 40 rises by 30 mm. Said stroke quantity, the lowering quantity of the upper unit and the rising quantity of the lower unit are not limited to said values, but proper modifications of them can also implement the present invention.

The above description has not shown in detail the structures of the upper member 31 of the upper unit 30 and the upper member 41 of the lower unit 40.

Figure 4:
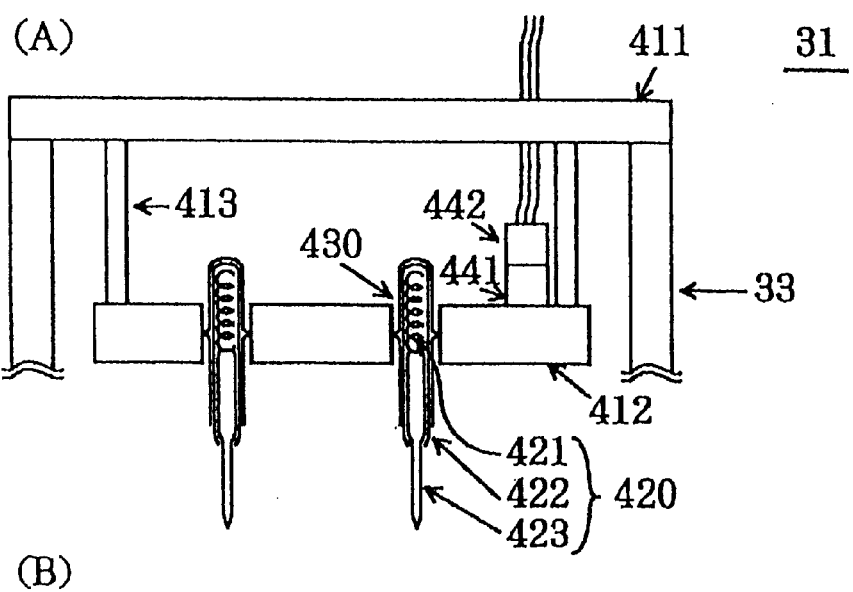
FIG. 4(A) is a schematic figure showing the structure of the upper member of the upper unit.
FIG. 4(B) is a perspective view showing the shape of amounting plate of the upper member of the upper unit.
FIG. 4(C) is a perspective view showing the shape of a probe plate of the upper member of the upper unit.
Figure 4:
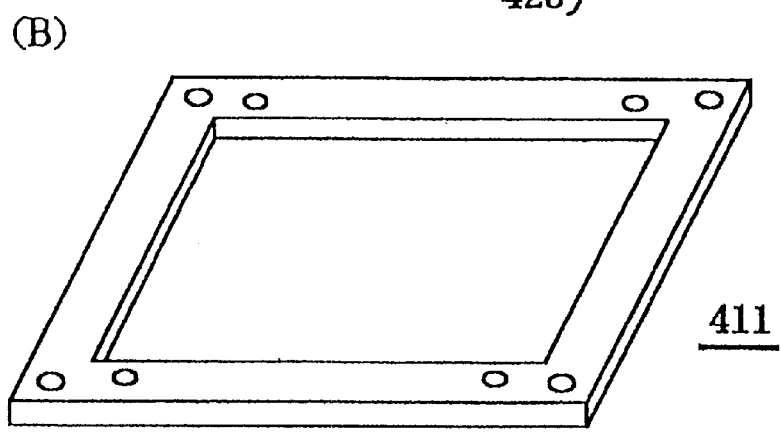
Figure 4:
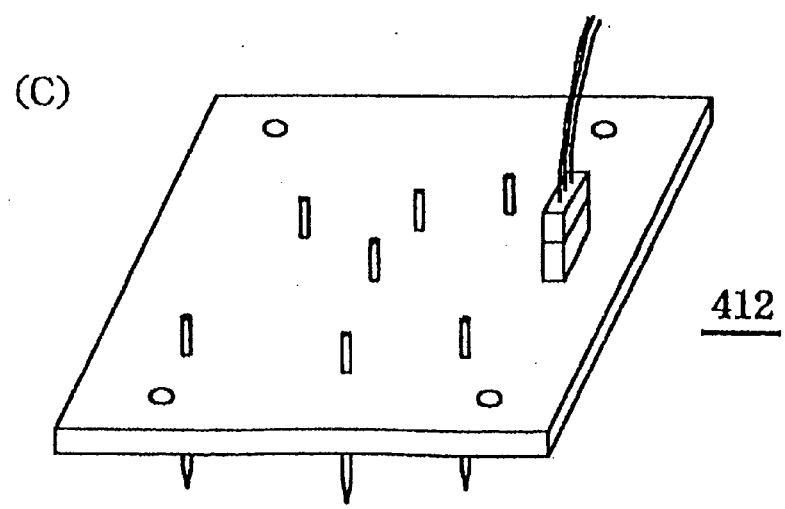
Figure 5:
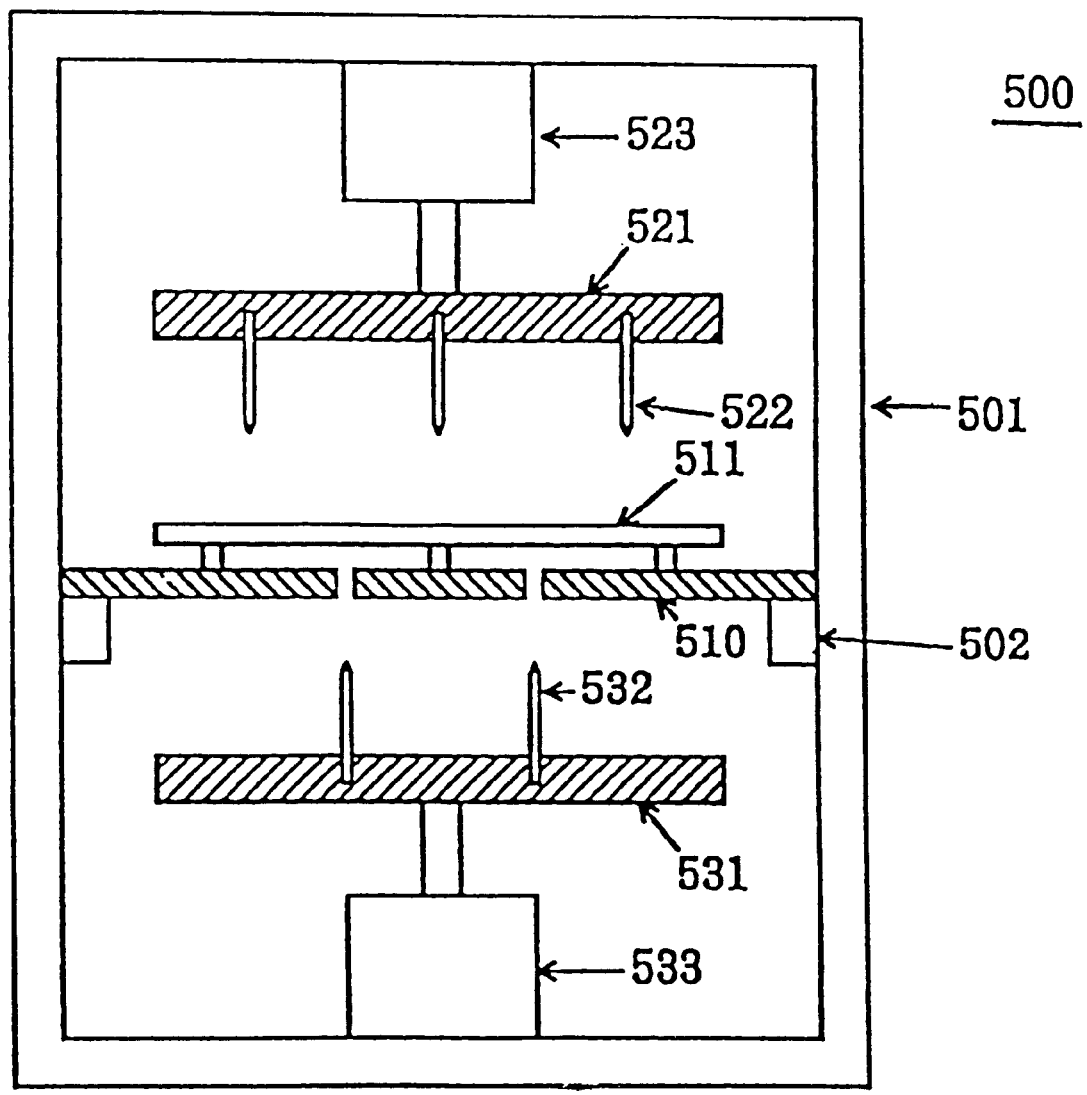
FIG. 5 is a schematic figure showing a conventional printed wiring board inspection apparatus.

Thereupon, the structure of the upper member 31 of the upper unit 30 is described with reference to FIG. 4(A). The upper member 41 of the lower unit 40 has also the same structure as FIG. 4 except that it is upside-down. As shown in FIG. 4(A), the upper member 31 of the upper unit 30 is composed of a probe plate 412 and a mounting plate 411. The mounting plate 411 is fixed to the coupling members 33 of the upper unit 30 by screws and the like. And the probe plate 412 is fixed to the mounting plate 411 through supporting poles 413 by screws and the like. Sockets 430 are press-fitted into the probe plate 411. A probe 420 is inserted into a socket 430. The sockets 430 and a first connector 441 are electrically connected with each other by means of unshown printed wiring, wrapped wiring and the like. Electric signals are transferred between the probes and an unillustrated tester through a second connector 442 connected to the first connector 441. In case of inspecting printed wiring boards of another kind, the probe plate 412 is replaced with another one. FIG. 4(B) shows the shape of the mounting plate 411 and FIG. 4(C) shows the shape of the probe plate 412.

FIG. 4(A) shows an example of the upper member 31 of the upper unit and the present invention is not limited to the composition of FIG. 4. For example, the probe plate 412 may be fixed directly to the coupling members 33 without putting the mounting plate 411 between them.

Although an embodiment of a printed wiring board inspection apparatus 10 of the present invention has been described above, the present invention is not limited to the above-mentioned embodiment but it may use another driving means such as a pneumatic cylinder having a spring built in it, an oil-hydraulic cylinder, a stepping motor and the like instead of the pneumatic cylinder of this embodiment.

And a case of inspecting the upper face and the lower face of a printed wiring board has been described, but an inspection apparatus of the present invention can be used also in case inspecting only one face of it. In case of inspecting only the lower face of a printed wiring board, for example, poles are set instead of the probes 35 of the upper unit 30. Since the printed wiring board 25 is supported from its upper face by said poles, the printed wiring board 25 is not lifted by a force applied to its lower face by the probes 45 of the lower unit 40 and therefore the lower face of the printed wiring board 25 can be inspected.

And although an example of forming a lower unit out of an upper member, a lower member and coupling members has been described, it is acceptable also to omit the lower member and the coupling members and connect the shaft of a pneumatic cylinder directly with the upper member. In this case, it can be considered that the shaft serves also as a lower member and a coupling member which are equal in diameter to the shaft.

Moreover, an apparatus obtained by turning upside down the apparatus shown in FIG. 1 (hereinafter referred to as an inverse-type apparatus) performs also a similar operation to the apparatus of FIG. 1. For example, the upper unit of the apparatus of FIG. 1 corresponds to the lower unit of an inverse-type apparatus, and the upper member of the lower unit of the apparatus of FIG. 1 corresponds to the lower member of the upper unit of the inverse-type apparatus.

A printed wiring board inspection apparatus of the present invention can move up and down the upper unit for inspecting the upper face of a printed wiring board and the lower unit for inspecting the lower face of the printed wiring board by means of a single driving means. As the result, the printed wiring board inspection apparatus can be made small and light. And since a dedicated driving means for driving the upper unit at the time of probing becomes unnecessary, the upper structure of the inspection apparatus is simplified and it becomes easy to replace an upper member provided with probes of the upper unit and an upper member provided with probes of the lower unit with other members.

What is claimed is:

1. A printed wiring board inspection apparatus for inspecting a printed wiring board by making probes touch the upper face and the lower face of said printed wiring board placed at a specified position, said printed wiring board inspection apparatus comprising:

a supporting body having a printed wiring board holding portion for holding said printed wiring board at a specified position;

an upper unit provided with probes for inspecting the tipper face of said printed wiring board;

a lower unit provided with probes for inspecting the lower face of said printed wiring board; and a single driving means for moving up and down said upper unit and said lower unit, wherein;

said upper unit and said lower unit are held by said supporting body so as to be able to move up and down;

said driving means moves up and down said upper unit and said lower unit relatively to said supporting body;

said upper unit is composed of an upper member provided with said probes, a lower member joined to said driving means and a coupling member for coupling both of them with each other;

said lower unit is composed of an upper in member provided with said probes, a lower member joined to said driving means and a coupling member for coupling both of them with each other; and the sum of the spacing between aid lower member of the upper unit and said lower member of the lower unit and the spacing between said upper member of the upper unit and said upper member of the lower unit is kept at a constant value in a process of moving up and down said upper unit and said lower unit.

2. Printed wiring board inspection apparatus according to claim 1 wherein;

said driving means is disposed between said lower member of the upper unit and said lower member of the lower unit, and moves up and down said upper unit and said lower unit by changing the spacing between said lower member of the upper unit and said lower member of the lower unit.

3. A printed wiring board inspection apparatus according to claim 2, wherein;

in case of enlarging the spacing between said lower member of the upper unit and said lower member of the lower unit, said upper unit has lowered and then said lower unit rises.

4. A printed wiring board inspection apparatus according to claim 3, wherein;

said lower unit is lifted as a result of limiting the lowering of said upper unit.

5. A printed wiring board inspection apparatus according to claim 2, wherein;

in case of making small the spacing between said lower member of the upper unit and said lower member of the lower unit, said lower unit has lowered and then said upper unit rises.

6. A printed wiring board inspection apparatus according to claim 5, wherein;

said upper unit is lifted as a result of limiting the lowering of said lower unit.

7. A printed wiring board inspection apparatus according to claim 1, wherein;

the sum of the weight of said upper unit and the weight of said lower unit is larger than the sum of pressures applied to all of said probes provided in said upper unit at the time of inspecting said printed wiring board.

* * * * *

UNITED STATES PATENT AND TRADEMARK OFFICE
CERTIFICATE OF CORRECTION

PATENT NO.   : 6,429,673 B1
DATED        : August 6, 2002
INVENTOR(S)  : Osamu Obata and Masatoshi Kato It is certified that error appears in the above-identified patent and that said Letters Patent is hereby corrected as shown below:

<u>Title page,</u>
Item [73], should read:
-- [73] Assignee: ICT CO., LTD., Yamanashi (JP) --

Signed and Sealed this

Tenth Day of December, 2002

JAMES E. ROGAN
*Director of the United States Patent and Trademark Office*